United States Patent [19]
Botti et al.

[11] Patent Number: 5,073,811
[45] Date of Patent: Dec. 17, 1991

[54] INTEGRATABLE POWER TRANSISTOR WITH OPTIMIZATION OF DIRECT SECONDARY BREAKDOWN PHENOMENA

[75] Inventors: Edoardo Botti, Vigevano; Aldo Torazzina, Monza, both of Italy

[73] Assignee: SGS-Thomson Microelectronics S.r.l., Agrate Brianza, Italy

[21] Appl. No.: 540,553

[22] Filed: Jun. 20, 1990

[30] Foreign Application Priority Data

Jun. 22, 1989 [IT] Italy ............... 20950 A/89

[51] Int. Cl.⁵ .................. H01L 29/72; H01L 27/02
[52] U.S. Cl. .......................... 357/34; 357/36; 357/46; 357/51; 357/86
[58] Field of Search ............ 357/34, 36, 46, 51, 357/86

[56] References Cited

U.S. PATENT DOCUMENTS

| | | | |
|---|---|---|---|
| 3,990,092 | 11/1976 | Yoshimura | 357/51 |
| 4,038,677 | 7/1977 | Nagel et al. | 357/51 |
| 4,486,770 | 12/1984 | Woodward | 357/34 |
| 4,656,496 | 4/1987 | Widlar | 357/36 |
| 4,682,197 | 7/1987 | Villa et al. | 357/46 |
| 4,800,416 | 1/1989 | Musemeci | 357/86 |
| 4,942,308 | 7/1990 | Conzelmann et al. | 357/51 |
| 4,947,231 | 8/1990 | Palara et al. | 357/51 |
| 4,949,139 | 8/1990 | Korsh et al. | 357/51 |
| 4,949,153 | 8/1990 | Hirao et al. | 357/51 |

FOREIGN PATENT DOCUMENTS

| | | | |
|---|---|---|---|
| 0329401 | 8/1989 | European Pat. Off. | 357/34 |
| 56-54064 | 5/1981 | Japan | 357/34 |
| 63-211757 | 9/1988 | Japan | 357/34 |
| 63-260076 | 10/1988 | Japan | 357/34 |
| 63-275175 | 11/1988 | Japan | 357/34 |

Primary Examiner—Andrew J. James
Assistant Examiner—Cynthia S. Deal
Attorney, Agent, or Firm—Guido Modiano; Albert Josif

[57] ABSTRACT

An integratable power transistor with optimization of direct secondary breakdown phenomena which comprises a plurality of elementary transistors which are arranged side by side and comprise a plurality of cells, each of which is formed by an emitter reigon surrounded by base and collector regions, with the emitter regions arranged physically separated. According to the invention, the base regions are also arranged physically separated and are mutually connected by resistive elements.

6 Claims, 3 Drawing Sheets

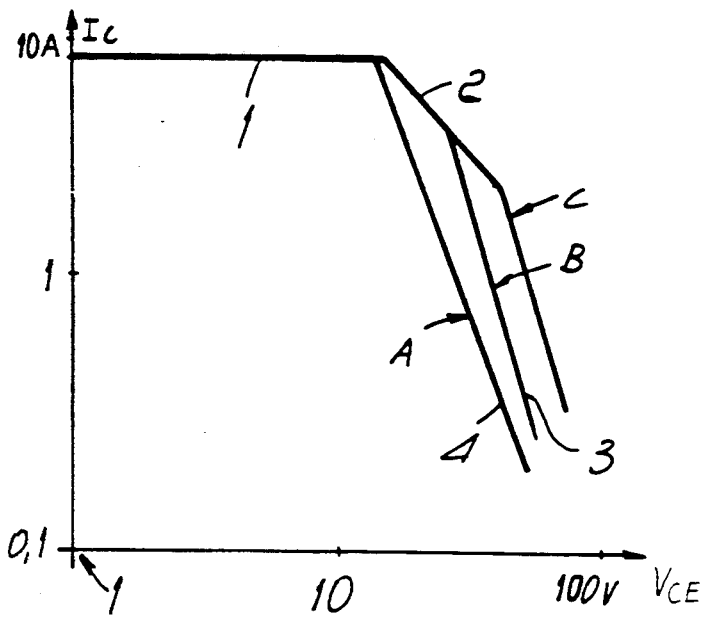
Fig. 1
PRIOR ART
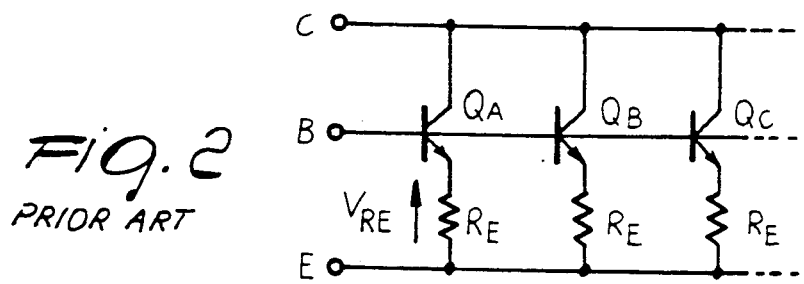
Fig. 2
PRIOR ART
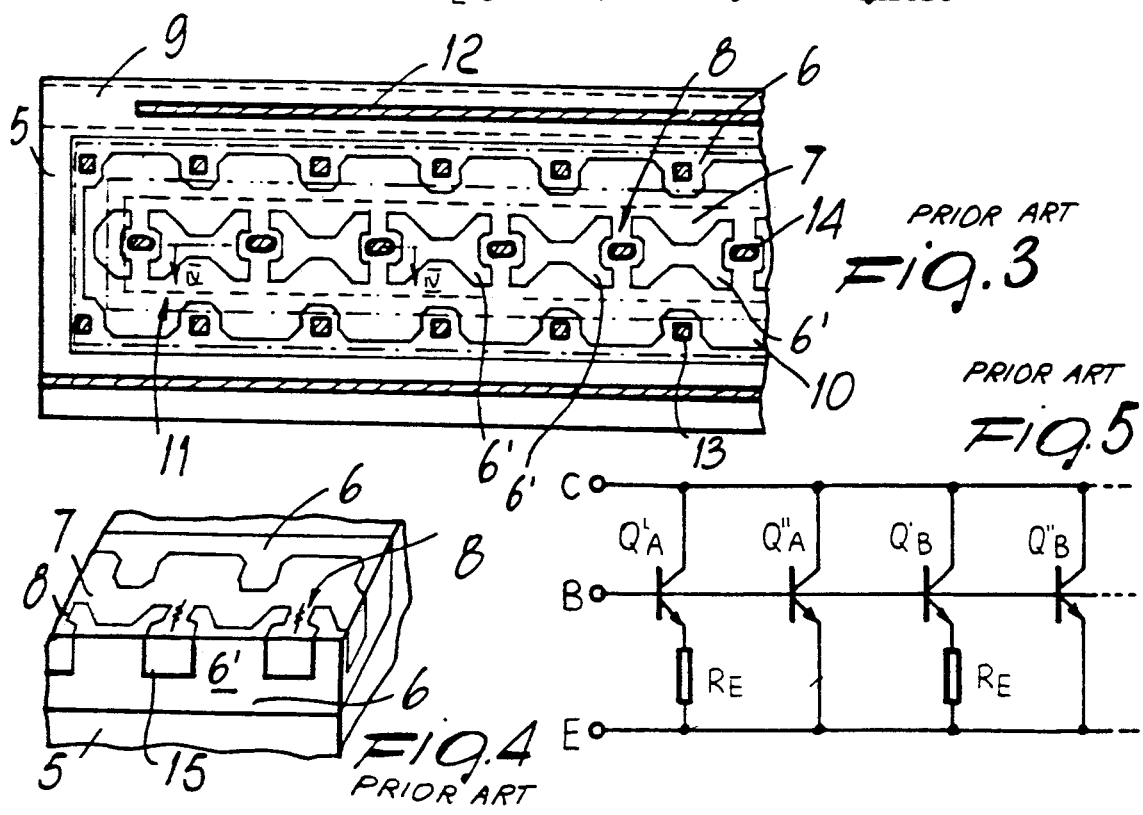
Fig. 3 PRIOR ART
Fig. 4 PRIOR ART
Fig. 5 PRIOR ART

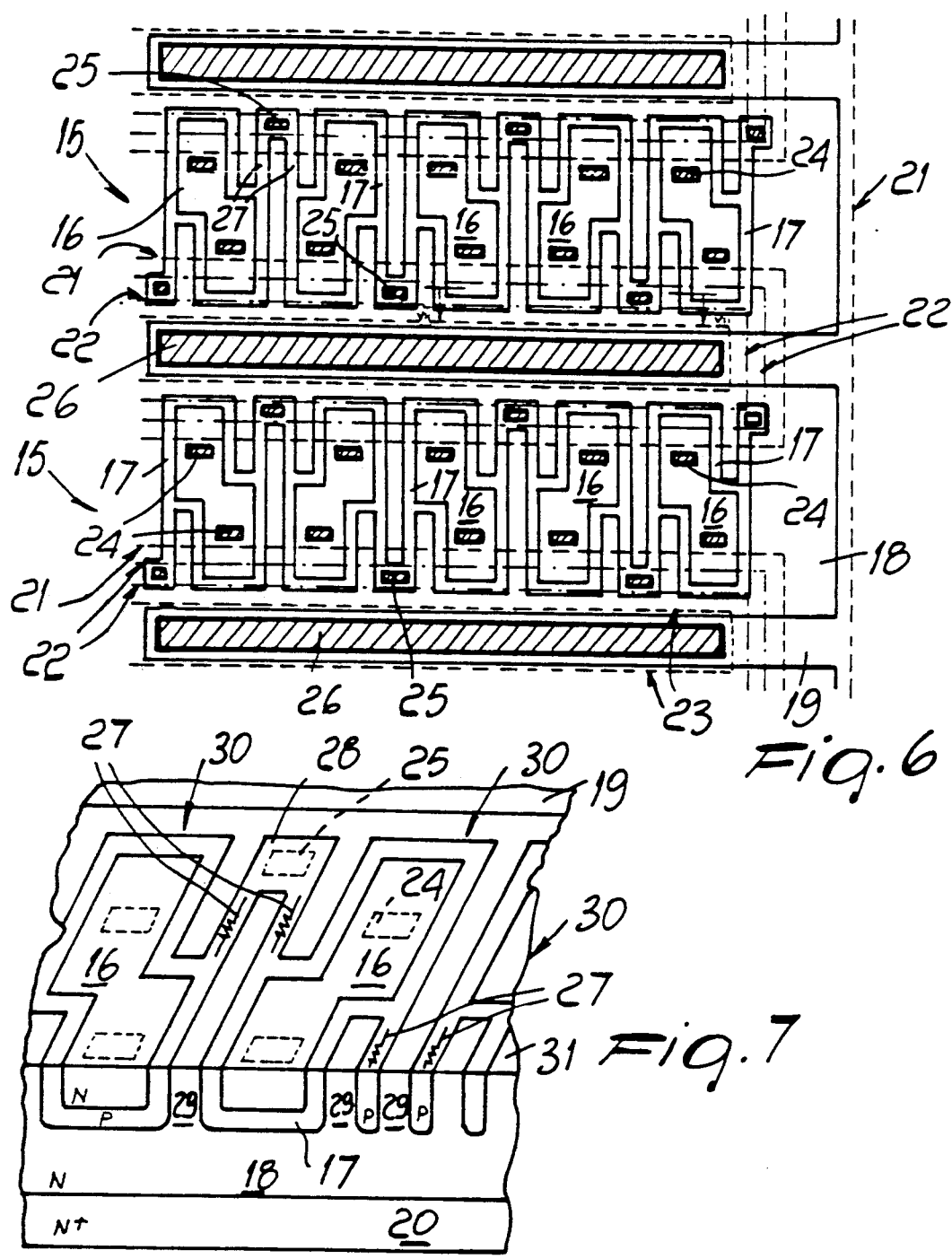
Fig. 6
Fig. 7
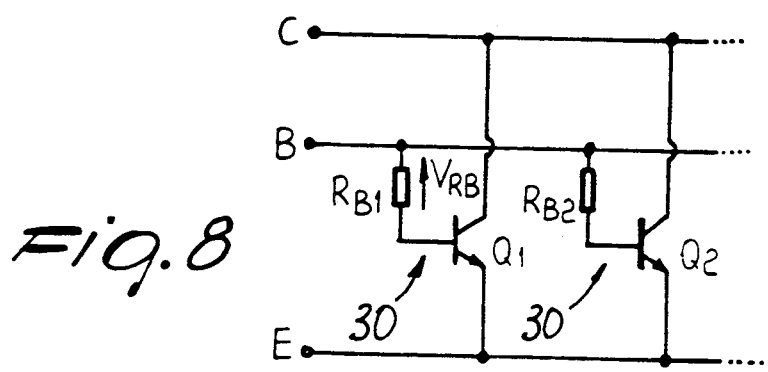
Fig. 8

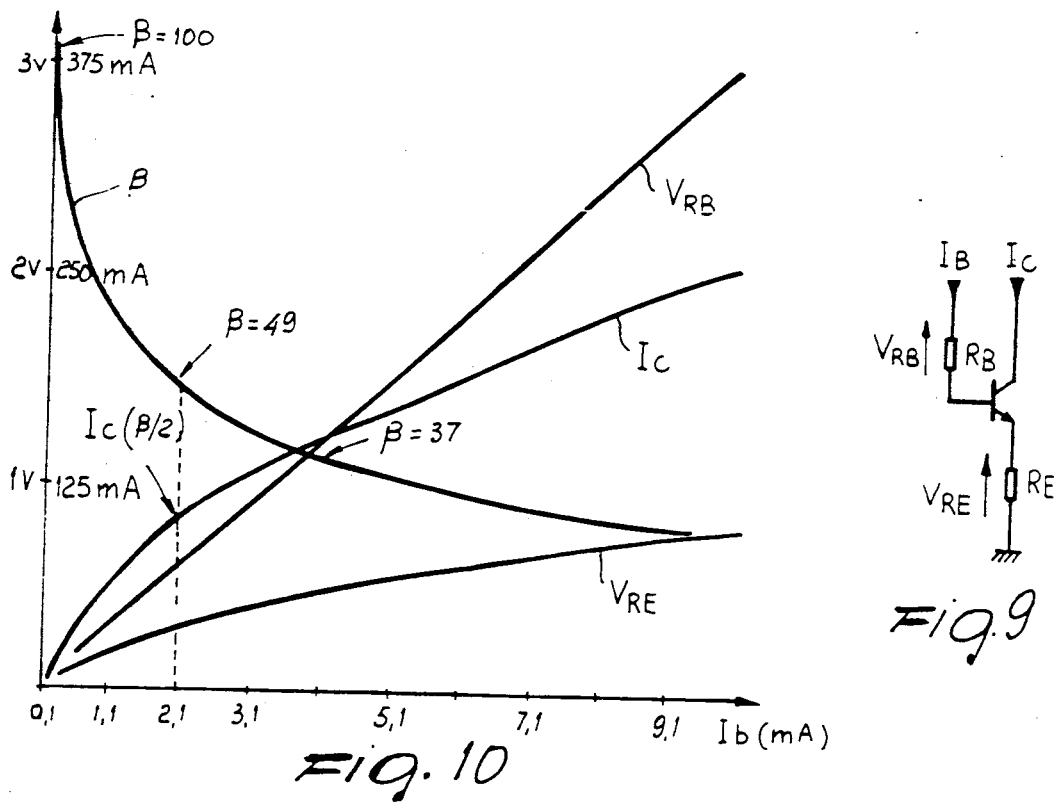
Fig. 10
Fig. 9
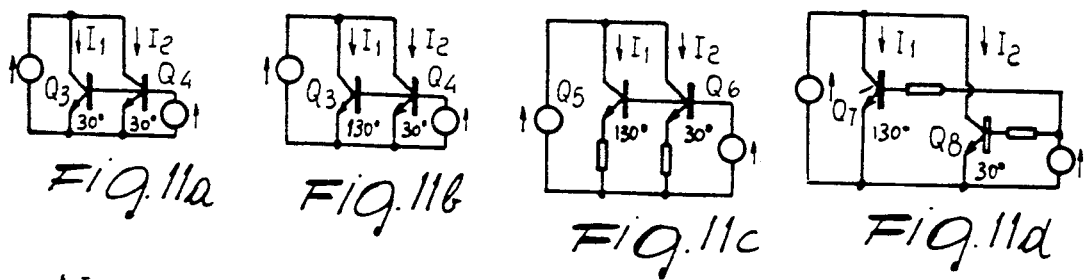
Fig. 11a  Fig. 11b  Fig. 11c  Fig. 11d
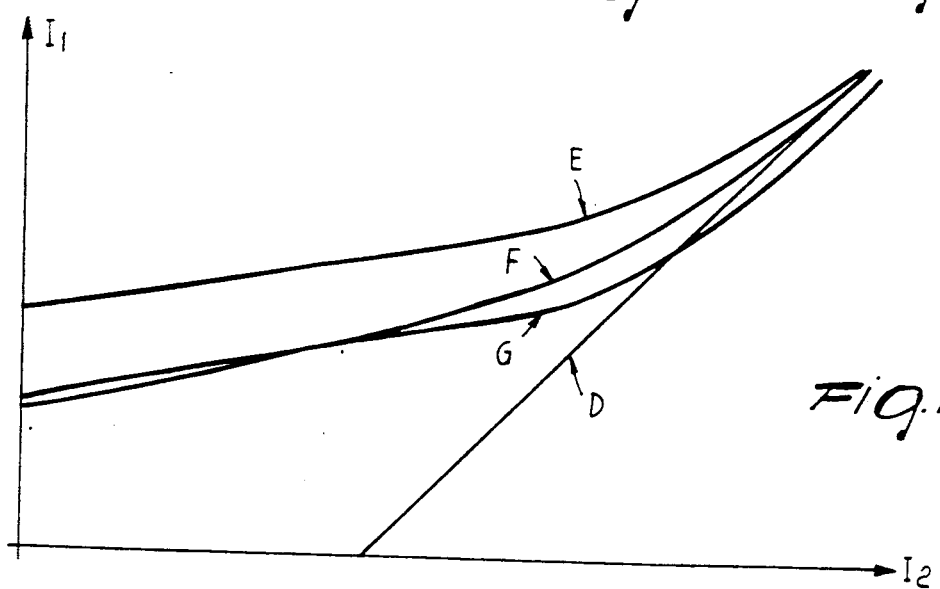
Fig. 12

INTEGRATABLE POWER TRANSISTOR WITH OPTIMIZATION OF DIRECT SECONDARY BREAKDOWN PHENOMENA

BACKGROUND OF THE INVENTION

The present invention relates to an integratable power transistor with optimization of direct secondary breakdown phenomena. In particular, the present invention relates to a power transistor wherein the emitter area is divided into a plurality of regions surrounded by base and collector regions which extend mutually parallel so as to form a plurality of elementary transistors or "fingers".

As known, one of the main problems associated with both integrated and discrete power transistors is linked to the phenomenon of direct secondary breakdown.

A typical plot of the curve (which traces the maximum collector current as a function of the voltage between the collector and the emitter) within which the transistor cannot suffer damage is shown in FIG. 1 and is indicated by A. The area delimited by said curve, which is known as SOA (Safe Operating Area), is limited upward by the maximum current which can be delivered by the collector (line 1) and then by a line, termed "second breakdown" line (line 4), which is destructive for the transistor although the power dissipated thereby, along said line, decreases as $V_{CE}$ increases. For example, in the case of a transistor which can carry, at 20 V of $V_{CE}$, a current of 4 A (and therefore dissipates a power equal to 80 W), the maximum collector current at 50 V can decrease to values around 200 mA, with a dissipated power of 10 W.

This phenomenon is due to the fact that the various regions of the power transistor are not fed uniformly: a variation in the base-emitter drop ($V_{BE}$) along the power transistor can cause an increase in the current which flows in a certain region, which will therefore tend to heat more than the others. Consequently, since $V_{BE}$ decreases as the temperature rises (by approximately 2 mV/°C.), the hottest region tends to conduct even more current, triggering a phenomenon which can be regenerative and leads to the breakdown of the power transistor in a narrow region thereof. In practice, the problem of second breakdown is due to the fact that in every finger there is a region (usually the central one) which is hotter, in which the above described phenomenon can occur and in which high temperatures (300°–400°) can be reached. Consequently even a single finger can undergo a second breakdown.

In order to obviate this disadvantage, an attempt has been made to distribute the current in the transistor as uniformly as possible.

A known solution in this sense consists in providing so-called "ballast" emitter resistors. This solution is shown by way of example in FIG. 2, which illustrates the equivalent circuit diagram of a power transistor of the NPN type. As can be seen, the transistor is composed of a plurality of elementary transistors $Q_A$, $Q_B$, $Q_C$ etc. which are connected in parallel, and a resistor $R_E$ is inserted between the emitter of each elementary transistor and a common point (which defines the emitter of the power transistor).

This structure allows to obtain an improvement in the SOA see curve B of FIG. 1, which again comprises a constant-current line—line 1—, a constant-power line—line 2—along which the transistor can be damaged due to the increase in temperature caused by dissipation, and the second breakdown line—line 3—) and in particular it is useful when the currents which flow in the transistor are relatively high, but for high voltages between the emitter and the collector ($V_{CE}$) the critical collector current ($I_C$) can be low, so that the voltage drop on the ballast resistor $R_E$ is also low and therefore the effectiveness of this system tends to disappear.

Especially in integrated circuits, said known structure is furthermore executed as shown in FIGS. 3 and 4, wherein the ballast resistors are formed by the emitter itself. In particular, said figures illustrate a portion of an elementary transistor (or "finger") in which 5 indicates the collector area, 6 indicates the base area and 7 indicates the emitter area. The base region 6 is executed so as to be unbroken, surrounds the emitter area 7 and furthermore extends inside said emitter area (regions 6' which are not diffused during the execution of the emitter regions) so as to form narrow strips 8 which define the ballast resistors. FIG. 3 furthermore illustrates the collector metallic layer (or "metal") 9, the contours whereof are indicated in broken lines, the base metallic layer 10 (dot-and-dash lines) and the emitter metallic layer 11 (broken lines), as well as the collector contacts 12, the base contacts 13 and the emitter contacts 14. Consequently, a part of the emitter (indicated by 15 in FIG. 4) which is arranged directly below the contact and is therefore highly activated, is free from the ballast resistors, so that the actual equivalent circuit diagram becomes the one illustrated in FIG. 5, wherein each cell of the power transistor $Q_A$, $Q_B$ etc. is replaced with a pair of transistors $Q'_A$, $Q''_A$ and respectively $Q'_B$, $Q''_B$, etc. This fact further reduces the effectiveness of this solution.

Other structures for increasing second breakdown are furthermore also known; however, they are more complicated, since they require particular drivings of the power transistor and therefore additional components which increase the area occupation and which therefore should desirably be eliminated.

SUMMARY OF THE INVENTION

Given this situation, the aim of the present invention is to provide an integratable power transistor which can optimize direct secondary breakdown phenomena.

Within the scope of this aim, a particular object of the present invention is to provide an integratable power transistor which can provide an improvement in direct secondary breakdown phenomena, in particular in regions operating with a low collector current.

An important object of the present invention is to provide an integratable power transistor which does not require the use of particular or additional driving components.

Not least object of the present invention is to provide an integratable power transistor which has great reliability and does not require, for its manufacture, devices or procedures which differ from those commonly used in the electronics industry.

This aim, the objects mentioned and others which will become apparent hereinafter are achieved by an integratable power transistor with optimization of direct secondary breakdown phenomena, as defined in the accompanying claims.

BRIEF DESCRIPTION OF THE DRAWINGS

The characteristics and advantages of the invention will become apparent from the description of a preferred embodiment, which is illustrated only by way of non-limitative example in the accompanying drawings, wherein:

FIG. 1 plots the curve which delimits the SOA for conventional transistors, for transistors provided with ballast resistors and for the transistor according to the invention;

FIG. 2 is a circuit diagram of the solution provided with ballast resistors;

FIG. 3 is a view of the arrangement of the areas of an integratable power transistor executed according to the solution of FIG. 2;

FIG. 4 is a transverse perspective sectional view taken along the line IV—IV of FIG. 2;

FIG. 5 is a view of the actual circuit diagram of the known solution according to FIGS. 2-4;

FIG. 6 is a view of the arrangement of the areas in a power transistor according to the invention;

FIG. 7 is a transverse perspective sectional view taken along the line VII—VII of FIG. 6, according to the invention;

FIG. 8 is a view of the equivalent electric diagram of the solution according to the invention;

FIG. 9 is a view of a test structure on which some comparison values are measured;

FIG. 10 is a graph showing some values measured on the structure of FIG. 9;

FIGS. 11a-11d are test structures on which some comparison values are measured; and FIG. 12 is a graph showing the results of the measurements performed on the structures on FIGS. 11a-11d.

DESCRIPTION OF THE PREFERRED EMBODIMENTS

Reference should now be made to FIGS. 6 and 7, which illustrate the arrangement of the areas of the power transistor according to the invention. Said transistor, in a per se known manner, is constituted by a plurality of elementary transistors or fingers 15 which are arranged side by side. According to the invention, each finger 15 is constituted by a plurality of cells 30 the base and emitter diffusions whereof are physically separated and have a smaller area. In particular, in the FIGS. 16 indicates the individual emitter areas, which are of the N type herein, 17 indicates the base areas, which are of the P type herein, 18 indicates the collector areas of the N type and 19 indicates the enhanced deep diffusion (sinker) regions of the N- type, whereas FIG. 7 furthermore illustrates the buried layer 20 of the N+ type. FIG. 6 also illustrates the metallic emitter connections 21 (the boundaries whereof are indicated in broken lines), the base connections 22 (dot-and-dash line) and the collector connections 23 (broken line), as well as the emitter contacts 24, the base contacts 25 and the collector contacts 26.

As can be seen, each individual emitter area 16 is surrounded by a base region 17 of its own, which is spaced from the base regions of the adjacent cells (see in particular the cross section of FIG. 7), and the different base regions 17 are connected to the base regions of the two adjacent cells by means of portions 27 which define resistors. The resistive portions 27 of two adjacent cells are mutually connected at an area 28 on which the base contact 25 is defined. Portions 29 of the collector region 18 extend between adjacent cells up to the larger surface 31 of the device and separate the base areas of the various cells from one another and from the resistive regions 27.

The equivalent circuit diagram of the structure according to the invention, illustrated in FIGS. 6 and 7, is shown in FIG. 8, wherein two cells 30 are represented by two transistors $Q_1$, $Q_2$: their collectors are mutually connected and define the common collector terminal C, their emitters are connected to one another and define the common emitter terminal E and their bases are mutually connected by means of respective resistors $R_{B1}$, $R_{B2}$ and define the common base terminal B.

In the power transistor according to the invention, the emitter areas and the value of the base resistors are chosen appropriately so as to improve the resistance of the power transistor to second breakdown phenomena. In particular, a first improvement is achieved by virtue of the execution of reduced emitter areas with respect to the known art (for example, in tests conducted by the Applicant, emitter areas of 5-7 mils$^2$ yielded good results). On small emitter areas, the temperatures can in fact be considered uniform, so that the phenomenon of second breakdown cannot occur in a single cell.

The execution of resistors between the base of each cell and the common base terminal furthermore allows to exploit a phenomenon which occurs in transistors and consists of the fact that the current gain $\beta$ (which decreases as the collector current increases), for small values of the collector current, increases with temperature but beyond a certain value of the collector current (which approximately corresponds to the value for which said gain is halved) decreases as the temperature increases.

Consequently, by virtue of the execution of smaller emitter areas, as $V_{CE}$ rises it is possible to reach higher collector currents without the occurrence of the phenomenon of second breakdown until one reaches the value for which the current gain $\beta$ is halved. After this, the base current rises much more than the collector current, generating a rapid increase in the voltage drop on the base resistor. In practice, considering one finger, initially some of the cells tend to heat more and therefore conduct more current. Beyond a certain collector current value, the current gain $\beta$ of these cells decreases rapidly, and the base current and the voltage across the base resistors rise. The more distant and colder cells, which have the same drop between the common emitter terminal and the common base terminal, consequently tend to conduct a current which is greater than, or equal to, that of the hot cell, making the phenomenon non-regenerative and thus obtaining the curve indicated by C in FIG. 1, with the consequent widening of the SOA.

FIG. 10 illustrates some values measured on a cell (as shown in FIG. 9) which is executed according to the invention and is furthermore provided with an emitter resistor in a known manner, so as to point out the better results which can be obtained by means of the invention In particular, the base resistor $R_B$ has been chosen one hundred times larger than $R_E$ (i.e. equal to the typical value of the amplifier gain) so as to have a comparable voltage drop. The graph illustrates the trend of the gain $\beta$, of the voltage drop $V_{RE}$ across the emitter resistor, of the voltage drop $V_{RB}$ on the base resistor according to the invention and the collector current $I_C$ as a function of the base current $I_b$.

As can be seen, the effect of the current gain drop of the individual cell is very evident on $R_B$, whereas it is negligible on $R_E$ since $R_E$ is essentially a function of $I_C$. Consequently, if the drop in current gain occurs in the region for which, at a given voltage $V_{CE}$, there is a risk of a second breakdown, the base resistor is capable of reducing to a larger extent the onset of destructive phenomena with respect to the emitter resistor.

In order to clarify the behavior of the transistor according to the invention, reference should be made to FIGS. 11a–11d and 12, which illustrate some comparative examples.

In FIG. 11a, two cells $Q_3$, $Q_4$ of a conventional power transistor, without base transistors and with joined base regions, are driven with identical $V_{CE}$ and $V_{BE}$ and are at the same temperature. They consequently conduct the same collector current, as shown in FIG. 12 (which shows the relation between the two collector currents $I_1$, $I_2$) by the line D. In FIG. 11b, the two cells of FIG. 11a have been brought to two different temperatures, namely $Q_3$ to 130° C. and $Q_4$ to 30° C. In this case, all the current tends to pass in the hottest transistor, since its $V_{BE}$ drops (curve E). If emitter ballast resistors are provided (FIG. 11c), the two transistors $Q_4$ and $Q_5$ (which are respectively at 130° C. and 30° C.) follow the curve F. FIG. 11d instead illustrates the case of two cells executed according to the invention, with transistors $Q_7$ and $Q_8$ with physically separated base regions, smaller emitter areas and base resistors. The two transistors have been heated as in FIGS. 11b and 11c. A behavior similar to the preceding one is initially obtained for this structure (curve G) while the collector current is smaller than the value for which the current gain is halved, since the hottest transistor conducts more current than the cold one; but after this critical value, the opposite occurs: the coldest transistor tends to conduct more current and therefore the situation tends to stabilize, as indicated by the fact that the curve G, at a certain point, intersects the line D for an equal current and has a portion which extends below said line D.

The emitter area is chosen according to the maximum required collector-emitter voltage drop $V_{CE}$: as the emitter area increases, the collector current at which the current gain $\beta$ halves in fact also increases in the same ratio. Consequently, in a given process, if the relation between current density and emitter area is exactly known, the emitter area is chosen so that, at the current for which the individual cell can cause undesirable second breakdown problems ($I_{s/b}$), the corresponding current gain is equal or smaller than half of the peak value.

The base resistor is chosen so that the voltage drop across the resistor is a significant fraction of $V_{BE}$, typically one half or one third. In general, as the base resistance increases, the curve G on the graph of FIG. 12 moves downward and intersects the line D sooner. The base resistor is conveniently chosen so that the two curves D and G intersect approximately at the current which corresponds to half of the peak value of the current gain, which is a substantially constant value (for a certain emitter area).

The execution of the resistors in the base, according to the invention, is advantageous also in view of the fact that said resistors have a temperature-positive trend (it increases by approximately 20% every 100° C. of temperature). This fact further aids in opposing the regenerative effect in a more marked manner than in the case of the known solution with emitter ballast resistors, since these, which are formed by the emitter diffusions themselves, have a lower temperature coefficient (10% for every 100° C.). With the structure according to the invention, for an equal base current there is in fact a greater voltage drop across the base resistor with respect to the emitter resistor and therefore a greater decrease in the base-emitter voltage drop of the individual transistor which constitutes the cell.

An advantage of the structure according to t he invention consists of its versatility: by varying the individual emitter areas and the value of the base resistors, it is in fact possible to optimize the second breakdown as the maximum applied collector-emitter voltage varies. Typically, as said voltage increases it is necessary to reduce the area of the individual cells. In particular, by means of the structure according to the invention, it is possible to trace the second breakdown curve before the structure is designed, knowing maximum dissipation. In fact, as already mentioned, the point at which the collector current is halved is practically constant, and so is the inclination of the second breakdown line.

Consequently, the area of a power transistor of this type is a function of the required SOA characteristics. It is therefore generally larger than a standard power transistor, but its behavior is improved. Besides, the area increase due to the separation of the areas is at least partly compensated by the area saving due to the elimination of further structures.

As can be seen from the above description, the invention fully achieves the proposed aim and objects. An integratable power transistor has in fact been provided in which, for collector currents in each cell which are higher than the currents for which the current gain is halved, the hottest cells absorb less current than the cold ones, expanding the safe operating area (SOA) of the transistor.

The invention thus conceived is susceptible to numerous modifications and variations, all of which are within the scope of the inventive concept. In particular, the fact is stressed that the base resistor, instead of being executed by means of the base diffusion itself, can be executed by means of polycrystalline silicon with appropriate resistivity and appropriate (positive) temperature coefficient which extends above the body of semiconductor material which defines the individual cells. This solution allows greater freedom in choosing the value of the resistor; in particular, said value can be larger due to the absence on which the base contact is executed and the collector region and which could, for high resistance values, entail a worsening of the saturation characteristics of the transistor.

All the details may furthermore be replaced with other technically equivalent ones.

We claim:

1. Integratable power transistor with optimization of direct secondary breakdown phenomena, comprising a plurality of elementary transistors having a common base terminal, said elementary transistors being arranged side by side and comprising a plurality of adjacent cells, each of which is formed by an emitter region surrounded by base and collector regions, wherein said base regions of adjacent cells are arranged physically separated from one another and wherein said base regions are connected by respective resistive elements to said common base terminal.

2. Power transistor according to claim 1, wherein said resistive elements are formed by the base diffusion.

3. Power transistor according to claim 1, wherein said emitter regions have an area such as at the collector current for which each of said cells can be subject to breakdown phenomena the current gain is at the most equal to half of its peak value.

4. Power transistor according to claim 1, wherein portions of said collector regions extend between said base regions of adjacent cells.

5. Power transistor according to claim 1, comprising a device layer surface, wherein portions of said collector regions extend between said base regions of adjacent cells up to said device layer surface.

6. Power device according to claim 3, wherein said area is in the order of 5-7 mils$^2$.

* * * * *